(12) United States Patent
Pullmann et al.

(10) Patent No.: US 7,656,629 B2
(45) Date of Patent: Feb. 2, 2010

(54) SAFETY SWITCH FOR A SAFETY CIRCUIT

(75) Inventors: Jürgen Pullmann, Ebersbach (DE);
Roland Rupp, Hattenhofen (DE)

(73) Assignee: Pilz GmbH & Co. KG, Ostfildern (DE)

( * ) Notice: Subject to any disclaimer, the term of this patent is extended or adjusted under 35 U.S.C. 154(b) by 0 days.

(21) Appl. No.: 11/581,039

(22) Filed: Oct. 13, 2006

(65) Prior Publication Data
US 2007/0091518 A1    Apr. 26, 2007

Related U.S. Application Data

(63) Continuation of application No. PCT/EP2005/003079, filed on Mar. 23, 2005.

(30) Foreign Application Priority Data

Apr. 19, 2004    (DE) .................. 10 2004 020 997

(51) Int. Cl.
*H02H 7/00*    (2006.01)
(52) U.S. Cl. .................................................... 361/62
(58) Field of Classification Search .............. 307/326; 361/62
See application file for complete search history.

(56) References Cited

U.S. PATENT DOCUMENTS

| | | | |
|---|---|---|---|
| 4,558,389 A * | 12/1985 | Black et al. ................ 361/88 |
| 5,218,196 A | 6/1993 | Dogul et al. | |
| 5,218,198 A * | 6/1993 | Bristow et al. ......... 250/227.24 |
| 5,416,363 A * | 5/1995 | Duesman ................. 327/143 |
| 5,687,192 A | 11/1997 | Meyer et al. | |
| 6,417,582 B1 | 7/2002 | Dold et al. | |
| 6,628,015 B2 * | 9/2003 | Pullmann et al. ............ 307/326 |
| 7,193,338 B2 * | 3/2007 | Ghali .................... 307/147 |
| 2005/0057868 A1 | 3/2005 | Pullmann et al. | |

FOREIGN PATENT DOCUMENTS

| | | |
|---|---|---|
| DE | 43 33 358 A1 | 4/1995 |
| DE | 298 06 059 U1 | 1/1998 |
| DE | 102 16 226 A1 | 10/2003 |
| EP | 1 363 306 A2 | 11/2003 |

* cited by examiner

*Primary Examiner*—Stephen W Jackson
*Assistant Examiner*—Ann T Hoang
(74) *Attorney, Agent, or Firm*—Harness, Dickey & Pierce, P.L.C.

(57) ABSTRACT

A safety switch for safety circuit arrangement has a control part for processing an input signal and at least one switching element with at least one active and one inactive switching state. The control part controls the switching element in order to generate an output signal dependent on the input signal at an output. In addition, the safety switch has a diagnostic function for identifying a functional fault. The control part is configured to transfer the switching element into the inactive state when a functional fault is identified. According to one aspect of the invention, the control part is also configured to generate a data message at the output, which data message is dependent on the functional fault.

25 Claims, 4 Drawing Sheets

SAFETY SWITCH FOR A SAFETY CIRCUIT

CROSS REFERENCES TO RELATED APPLICATIONS

This application is a continuation of International Patent Application PCT/EP2005/003079 filed on Mar. 23, 2005 and published in German language on Oct. 27, 2005, which International Patent Application claims priority under the Paris convention from German patent application DE 10 2004 020 997.9 filed on Apr. 19, 2004.

BACKGROUND OF THE INVENTION

The present invention relates to a safety switch or a signalling device for a safety circuit arrangement, and more particularly to a safety switch that comprises a diagnostic function for identifying a malfunction or a functional fault.

EP 1 363 306 A2 discloses a safety switch for monitoring the position of protective doors, machine covering parts or other protective devices for protecting rotating machine parts or other hazardous places. Such a safety switch is sometimes referred to as a signalling device. The safety switch is used for generating a safety-related signal which is supplied to a higher-level safety controller. The safety controller is configured to evaluate the signals of a number of safety switches or signalling devices and, in dependence thereon, to bring the hazardous installation into a safe state, for example switching off moving drive systems. In this arrangement, the safety controller is generally implemented separately from the operational controller of the installation, since the safety roller must meet much higher standards of fail-safety compared to a "simple" operational controller.

However, safety switches in the sense of the present invention are not only signalling devices but also what is typically called safety switching devices or safety relays and even programmable safety controllers, i.e. even those devices which are typically designed to evaluate input signals from signalling devices. Nevertheless, the preferred field of application of the present invention is signalling devices for safety-related applications. Such signalling devices are sometimes also called safety sensors.

Signalling devices/sensors for safety-related applications must be constructed to be fail safe, as the safety controllers/safety switching devices too, in order to ensure that the intended safety function is fulfilled at any time. Intelligent sensors, such as light barriers or light curtains, are therefore typically constructed to be inherently fail safe so that they meet categories 3 or even 4 of the European standard EN 954-1 or similar safety requirements. Although simple signalling devices such as emergency-off buttons, protective door switches, two-handed switches and the like are also redundant, as a rule, they do not have any, or have only a limited intelligence, in practice. As a rule, fault monitoring is then implemented by means of the higher-level safety controller or the higher-level safety switching device.

EP 1 363 306 A2, mentioned before, discloses a safety switch which has its own diagnostic function. In particular, tis known safety switch is capable of monitoring the operation of the switching elements by reading back its output signals.

The document also discloses a safety circuit arrangement in which a number of such safety switches are connected in series with one another to a higher-level safety controller. In this arrangement, an enable signal is looped through the switching elements of the individual safety switches up to the higher-level safety controller. As soon as one of the safety switches suppresses the enable signal by means of its switching elements, the enable signal is missing at the safety controller which thereupon places the monitored installation into a safe position of rest.

However, with the known safety circuit, the individual safety switches (signalling devices) cannot inform the safety controller about the results of their diagnosis. Although a fast switch-off of the monitored installation is thus enabled, it is not possible to draw a conclusion about the cause of the switch-off.

In more intelligent sensors such as, for example, light barriers or light curtains, it is known to signal diagnostic information to a higher-level safety controller by using separate diagnostic lines or a field bus connection for this purpose. This would be too complex and too expensive for "small" signalling devices, particularly mechanically operated signalling devices.

SUMMARY OF THE INVENTION

Against this background, it is an object of the present invention to provide for a safety switch of the type mentioned above but an increased flexibility and diagnostic capability. It is another object of the invention to provide for an inexpensive safety circuit arrangement, in particular for safeguarding a hazardous installation, which arrangement comprises an increased diagnostic capability.

According to one aspect of the invention, this object is achieved by a safety switch for a safety circuit, comprising at least one input and one output, a control part for processing an input signal provided at the input, at least one switching element having at least one active and one inactive switching state, and a diagnostic function for identifying a functional fault, wherein the control part is configured to control the switching element in order to generate an output signal at the output dependent on the input signal, wherein the control part is configured to transfer the switching element into the inactive state when a functional fault is identified, and wherein the control part is further configured to generate a data message at the output, which data message is dependent on the functional fault identified safety switch of the type mentioned initially, wherein the control part is also configured to generate a data message at the output, which data message is dependent on the functional fault identified.

According to another aspect, there is provided a safety circuit arrangement for fail-safely switching off a hazardous installation having a power supply path, comprising at least a first and a second safety switch and comprising a higher-level safety controller configured to interrupt the power supply path to the installation as a function of the safety switches, wherein the first and second safety switch each comprise at least one input and one output, a control part for processing an input signal provided at the input, at least one switching element having at least one active and one inactive switching state, and a diagnostic function for identifying a functional fault, wherein the control part is configured to control the switching element in order to generate an output signal at the output dependent on the input signal, wherein the control part is configured to transfer the switching element into the inactive state when a functional fault is identified, and wherein the control part is further configured to generate a data message at the output, which data message is dependent on the functional fault identified, and wherein the safety controller is configured to receive and process the data messages of the safety switches.

The new safety switch and circuit arrangement are thus based on the concept of transmitting diagnostic information of a safety switch along the already existing safety lines, by means of which the safety switch typically transmits a switch-off command to the higher-level controller. It is thus possible to dispense with a field bus connection or additional diagnostic lines. In contrast to all previous approaches, this is easily possible since the existing safety lines (the safety outputs) are without function after a monitored installation has been switched off, until the installation is taken again into operation. It is thus possible to transmit diagnostic data to the higher-level safety controller during this phase.

The new circuit arrangement saves connections at the individual devices and enables a safety circuit to be configured with a comprehensive diagnostic function, but with little wiring effort. Signalling devices or other safety switches are preferably connected in series with one another to the higher-level safety controller in order to further reduce the wiring effort.

The new safety switch thus provides for a cost-effective and flexible configuration of a safety circuit with comprehensive diagnostic function but without the complexity and costs of additional communication lines.

In a preferred embodiment, the control part is configured to generate the data message by means of the at least one switching element.

As an alternative, the control part, for generating the data message, could also drive an additional switching element which is connected to the output line. Using the existing switching element, however, saves further costs and reduces the required construction space.

In a further embodiment, the new safety switch has at least two mutually redundant switching elements arranged for being controlled redundantly by the control part.

Using redundant switching elements is well known per se in the field of safe automation technology. In the context of the present invention, however, the use of redundant switching elements increases not only the fail-safety but also the availability. Even if one of the switching elements is no longer capable of carrying out switching functions due to a functional fault (breakdown in semiconductor switching elements, contact welding in relay etc.), the new safety switch can still deliver all diagnostic information via the redundant channel. Although the lack of any diagnostic data would indicate the failure of the switching elements at the output end, the present embodiment provides for a more extensive diagnostic without significantly increasing the wiring and cost expenditure.

In a further embodiment, the control part is configured to control the switching element pulsewise in order to generate a pulse-shaped data message.

Using pulse-shaped data messages can be implemented in a very simple manner. On the other hand, it provides the possibility of also transmitting large volumes of data with serial protocols via a few lines. The use of pulse-shaped data messages is thus a particularly cost-effective way of achieving a high degree of diagnosis with little wiring effort.

In a further embodiment, the control part is configured to include an address in the data message.

It is thus possible for each signalling device, more generally each safety switching device, to report its identity to the higher-level controller. Consequently, a detailed diagnosis of the entire safety circuit can be achieved even more simply and selectively.

In a further embodiment, the new safety switch has at least one input for an external enable signal which forms the input signal.

This embodiment is particularly advantageous for transmitting the diagnostic data serially from one safety switch to the next. A downstream safety switch can receive the diagnostic data of an upstream safety switch via said input and reproduce it at its output. In addition, the downstream safety switch, in this embodiment, has the ability of supplementing and/or changing the received diagnostic data if this is desired. The diagnostic capabilities are thus even more flexible.

In a further embodiment, the new safety switch has an initialization mode in which the control part generates, by means of the at least one switching element, a pulse sequence which contains more pulses than an enable signal supplied at the input.

In a simple and cost-effective manner, this embodiment provides for automatic address allocation to a number of safety switches arranged in series with one another. As is described below in connection with a preferred embodiment, adding pulses results in an allocation of addresses in the manner of an "up-counter". The associated automatic system adapts itself to changes in the safety circuit (adding or removing a safety switch) and thus avoids errors. In addition, this type of address allocation is possible without additional hardware effort, and is therefore cost-effective.

In a further embodiment, the new safety switch has at least one input part for an actuator adapted to be alternated between a first state and at least one second state, with the input part generating the input signal.

This embodiment defines the new safety switch as a signalling device. Since in a complex safety circuit, a plurality of signalling devices often must be connected to one or a few safety controllers, the advantages of the invention are particularly effective in this embodiment. The present invention is particularly advantageous in mechanically operated signalling devices, particularly protective door switches, emergency-off buttons, two-handed switches, start or control buttons and position switches. These "simple" signalling devices have hitherto only been equipped with few diagnostic functions, if at all. In addition, these are comparatively cost-effective components, for example in comparison with an intelligent light barrier which is why high expenditure for implementing diagnostic functions has hitherto not been worthwhile. Using the present invention, however, these simple signalling devices, especially, can be connected with a high diagnostic function but little wiring expenditure to a higher-level safety controller.

It goes without saying that the aforementioned features and those yet to be explained in the following can be used not only in the combination specified in each case but also in other combinations or by themselves without departing from the context of the present invention.

BRIEF DESCRIPTION OF THE DRAWINGS

Exemplary embodiments of the invention are shown in the drawing and will be explained in greater detail in the description following. In the drawing.

DESCRIPTION OF PREFERRED EMBODIMENTS

Figure 1:
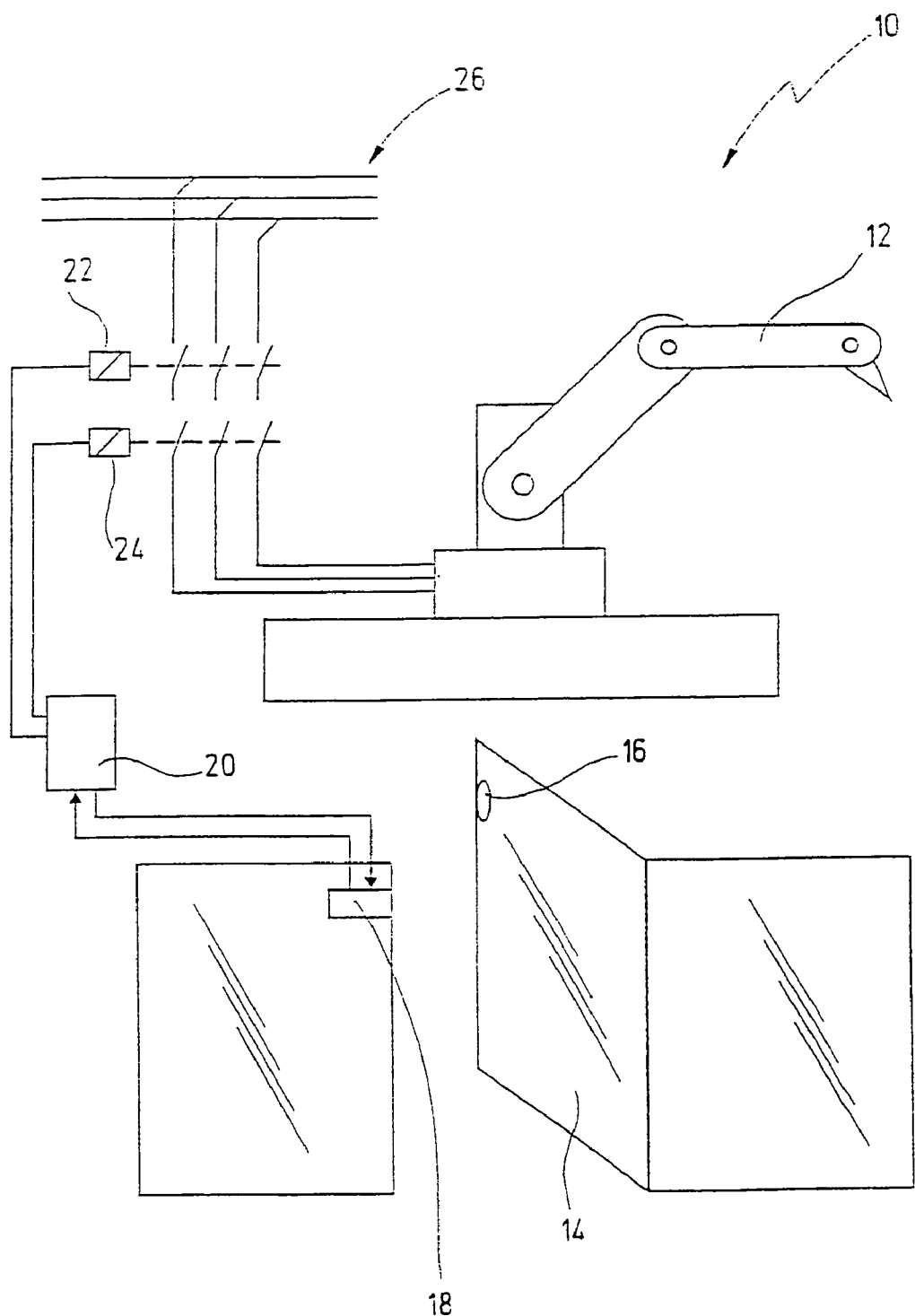
FIG. 1 shows a simplified representation of an installation in which a signalling device according to the present invention is used for protection.

In FIG. 1, an installation to be protected in accordance with the invention is designated overall by reference number 10.

The installation 10 in this case contains a robot 12, the automated movements of which would be hazardous to a person (not shown here) staying within the range of movement of the robot 12. As is known per se, the range of movement of the robot 12 is therefore protected by means of a protective door 14 and protective fences. On the protective door 14, an actuator 16 is mounted. On a fixed frame, against which the protective door 14 rests in the closed state, a safety switch 18 is located, more generally a signalling device according to the present invention. The safety switch 18 is connected to a safety controller 20 via a number of lines. The safety controller 20 controls at its output two contactors 22, 24, the contacts of which can interrupt the power supply 26 to the robot 12.

The installation 10 is shown here in simplified manner. As is known to the skilled person, the protective door 14 is usually equipped with at least two safety switches 18 and corresponding actuators 16, wherein one of the safety switches often is arranged in a hidden manner in order to make manipulations more difficult. In addition, such an installation often contains other signalling devices such as, for example, emergency-off buttons or other protective door switches (not shown here). In addition, the required operating control for the robot 12 is not shown for the sake of simplicity.

In a simple scenario, the safety controller 20 can be a safety switching device as provided by the applicant under the brand name PNOZ®. If numerous safety-related signalling devices are needed for protecting the installation 10, however, it is advantageous to use a more complex safety controller such as, for example, the safety controllers sold by the applicant under the brand name PSS®. At least in the latter case, the safety controller 20 usually has a field bus connection and further interfaces for communicating with the operational controller, not shown here, and/or for communicating with a higher-level control computer.

Figure 2:
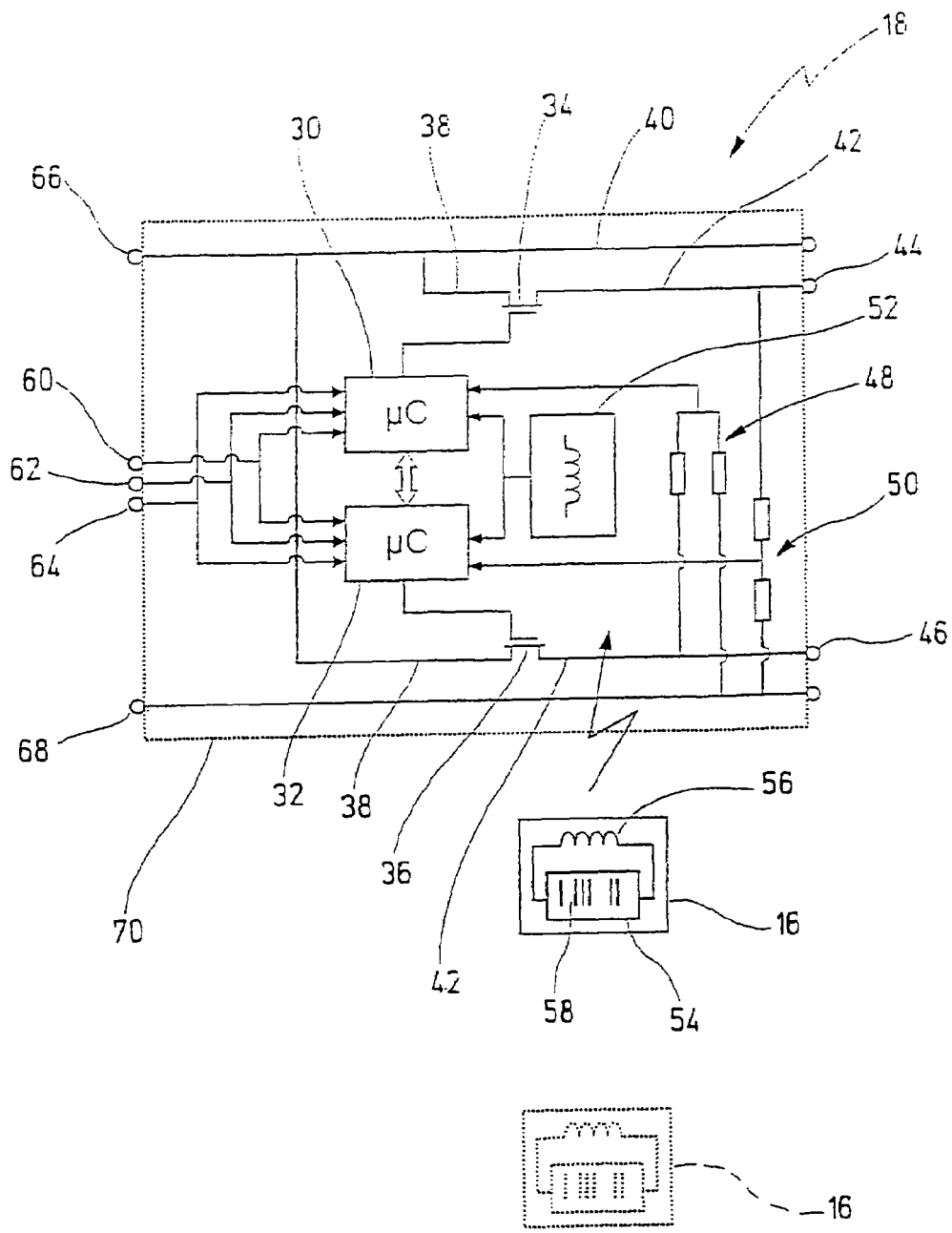
FIG. 2 shows a diagrammatic representation of an exemplary embodiment of the new signalling device.

In the preferred exemplary embodiment according to FIG. 2, the safety switch 18 is constructed with two-channel redundancy. Accordingly, the safety switch 18 has two redundant microcontrollers 30, 32 which monitor each other, which is represented by a double arrow between the microcontrollers. In preferred exemplary embodiments, the microcontrollers are different, i.e. the safety switch 18 is constructed with diversity.

Reference numbers 34, 36 designate two electronic switching elements which are shown here as field effect transistors. As an alternative, however, bipolar transistors or other, preferably electronic switching elements can also be used.

The control connection (gate) of the switching element 34 is connected to the microcontroller 30. The input 38 (source) is connected to a line 40 at which an operating voltage $U_B$ is present when the safety switch 18 is in operation. The output 42 (drain) is connected to a terminal 44 at which the safety switch 18 can be wired externally. The output 42 of the switching element 34 thus forms an output signal of the safety switch 18.

The second switching element 36 is connected at its control connection (gate) to the microcontroller 32. Its input 38 is also at operating voltage $U_B$ via the line 40. Its output 42 is supplied to a second output terminal 46 of the safety switch 18.

The signals at the outputs 42 of the switching elements 34, 36 are coupled back to the microcontrollers 30, 32 via two voltage dividers 48, 50. The microcontrollers 30, 32 are thus able to monitor the respective switching state of the switching elements 34, 36.

Reference number 52 designates an input part by means of which the microcontrollers 30, 32 determine the current state of the actuator 16. In the preferred exemplary embodiment shown here, the actuator 16 is a transponder with a signal generating circuit 54 and a transmitting and receiving coil 56. In the signal generating circuit 54, an individual coding 58 is stored. The input part 52 also has a transmitting and receiving coil (shown only symbolically here) via which it sends out an interrogation signal. As soon as transponder 16 is in the near field of the input part 52 (protective door closed), the signal generating circuit 54 in the actuator 16 is activated. The actuator 16 then sends the stored coding 58 back to the input part 52. There, the coding 58 is demodulated from the received signal and provided to the microcontrollers 30, 32.

If, in contrast, the protective door 14 is opened, the actuator 16 is outside the transmitting and receiving range of the input part 52 which is shown in position 16' in FIG. 2. In this case, there is no communication between actuator 16 and input part 52. The microcontrollers 30, 32, in consequence, do not receive any coding which is interpreted as open protective door 14. If there is a second protective door switch or at least one second actuator (not shown), a defect of the actuator 16 or of the input part 52 can also be identified. Use of transponders for monitoring protective doors is already known in the field of safety engineering, for example from EP 0 968 567 B1.

In other exemplary embodiments, the input part 52 can be configured to other types of actuators. The actuator can also be integrated in the safety switch 18. For example, the safety switch 18 could be an emergency-off button and the actuator is in this case the plunger of the button. In other exemplary embodiments, the input part 52 contains inductive, capacitive, optical or other types of sensors for determining a current position of a mechanically moveable actuator. In addition, the invention can basically also be used with light barriers and other signalling devices which distinguish between at least two states.

At the input end, the safety switch 18 has here three terminals 60, 62, 64 which are in each case arranged as safety inputs and are redundantly connected to the two microcontrollers 30, 32. Via the terminals 60 to 64, the microcontrollers 30, 32 can be supplied redundantly with external enable signals. In addition, there is a terminal 66, in a manner known per se, for supplying an operating voltage $U_B$ and a ground terminal 68. Naturally, these terminals are in each case accessible on the outside of a housing 70 of the safety switch 18.

Figure 3:
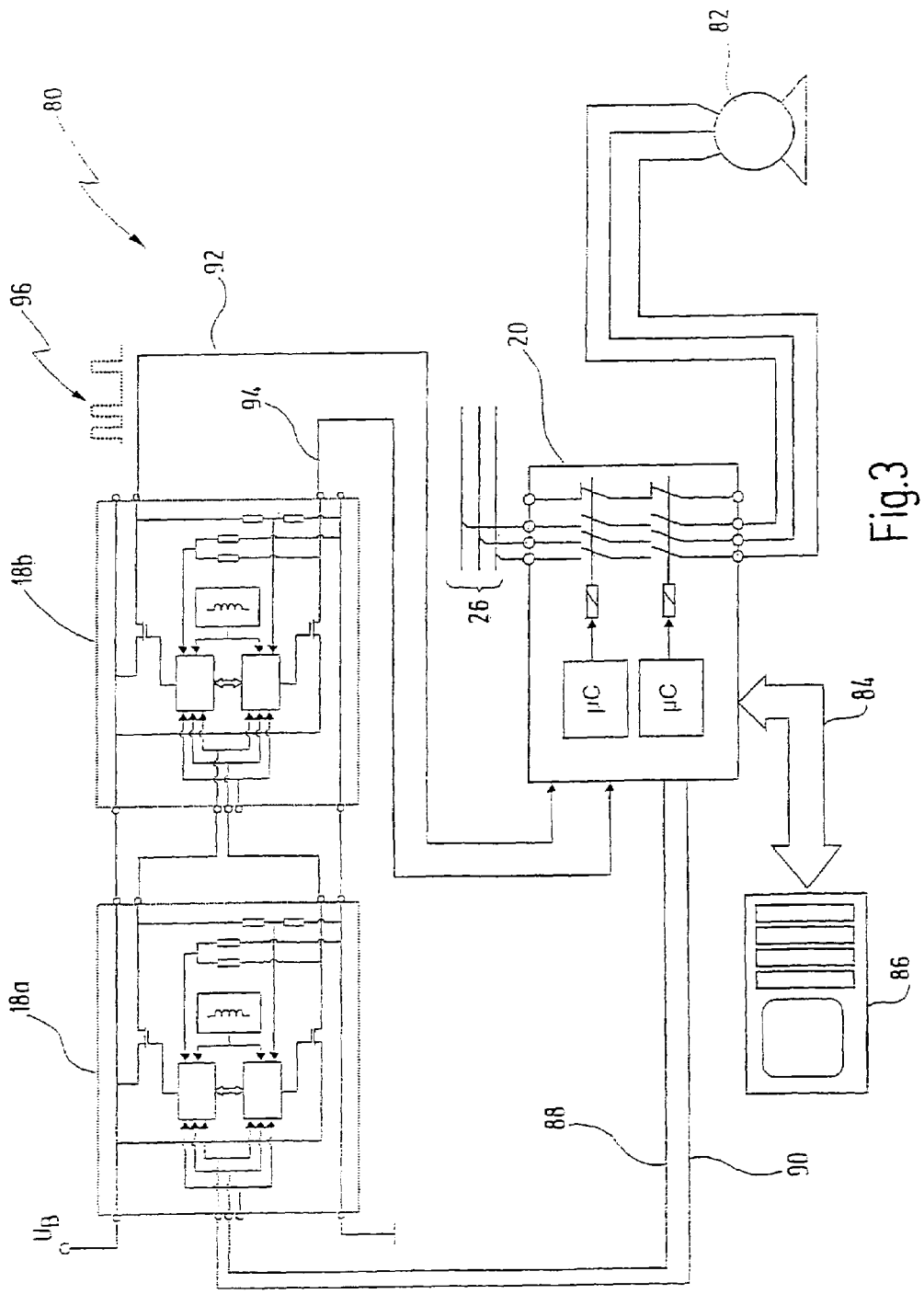
FIG. 3 shows a safety circuit with two signalling devices of the type shown in FIG. 2 in a series arrangement.

In FIG. 3, a safety circuit with two of such safety switches 18 is designated overall by reference number 80. For the rest, identical reference numbers designate identical elements as before. The two safety switches are designated by 18a and 18b to be distinguishable from one another.

The safety switch 18a is connected at its terminals 60, 62 to outputs of the safety controller 20. These are preferably so-called clock outputs of the safety controller 20 at which two clock signals of different frequency are present so that a cross connection can be identified both in the safety switch 18a and in the safety controller 20 (by reading back, not shown here). In addition, the safety switch 18a is connected to operating voltage $U_B$ and ground at terminals 66 and 68, respectively. At the output end, the terminals 44, 46 of the safety switch 18a are connected to terminals 60, 62 of the subsequent safety switch 18b. The two safety switches 18a, 18b are thus arranged in series with one another. In the arrangement shown, the safety switch 18b also receives its operating voltage from the safety switch 18a. As an alternative, the safety switch 18b could also be connected to another source for the operating voltage $U_B$.

The two output signals of the safety switch 18b, i.e. the signals present at its terminals 44, 46, are supplied to safety inputs of the safety controller 20. At the output end, the safety controller 20 is connected between the power supply 26 and a drive 82 to be switched off, for example an actuating drive of the robot 12. In addition, it is shown here schematically that the safety controller 20 is connected to an operational controller 86 for the robot 12 and/or a higher-level control computer via a field bus 84. The actuators belonging to the safety switches 18a, 18b are not shown in FIG. 3 for reasons of clarity.

The safety circuit 80 operates as follows: After it has been taken into operation, the safety controller 20 generates at its outputs two clock signals 88, 90 which are supplied as enable signals to the safety switch 18a. The microcontrollers 30, 32 of the safety switch 18a monitor the current state of the associated actuator by means of the input part 52. If the actuator is within range of the input part 52 and if the enable signals 88, 90 are correctly received, the microcontrollers 30, 32 generate, by means of the switching elements 34, 36, two output signals which are duplicates of the enable signals 88, 90. However, they could also differ from the clock signals 88, 90, for example with regard to their frequency. The second safety switch 18b receives the duplicated enable signals and duplicates them in turn at its output when it also finds a closed protective door and correct operation. The safety controller 20 receives the duplicated enable signals via the lines 92, 94.

If then the safety switch 18a detects the opening of its associated protective door, i.e. when the associated actuator changes its state, the microcontrollers 30, 32 open the switching elements 34, 36. In consequence, the following safety switch 18b no longer receives the duplicated enable signals. This is detected by the microcontrollers in the safety switch 18b and signaled to the safety controller 20 by switching off the switching elements 34, 36. The controller can then switch off the drive 82.

The signal flow is the same when the safety switch 18a detects a functional fault, for example a cross connection at the terminals at the input or output end, a breakdown of one of the switching elements 34, 36 or any other functional fault. After a short waiting time which is stored in the microcontrollers of all safety switches and the safety controller, the safety switch 18a generates a data message 96 on at least one of its output lines by closing and opening again in a pulsed manner at least one of the switching elements 34, 36. The subsequent safety switch 18b receives this data message and forwards it in the same manner to the safety controller 20. If necessary, it can also integrate other information in the data message 96.

In one exemplary embodiment, the data message 96 is implemented in the same manner as in the case of an asynchronous serial interface, i.e. it begins with a defined start bit and ends with a defined stop bit. Between these, there is an arbitrary or fixed number of data bits. In another exemplary embodiment, each data message 96 contains a fixed number of pulses with defined pulse duration. The significance of each individual pulse depends on the protocol which is established between the safety switches 18 and the safety controller 20.

In the same manner, the safety switch 18b generates its own data message 96 if it, in turn, finds a functional fault. In contrast to the known arrangement, the safety switch 18b can generate its data messages independently of whether the safety switch 18a has opened or closed the switching elements 34, 36.

In a preferred embodiment, the data messages of the safety switches 18a, 18b contain an address information item which identifies that safety switch which wishes to signal information to the higher-level safety controller 20. The respective address can be allocated for the safety switches 18a, 18b in various manners. For example, each safety switch 18a, 18b can be provided with a multi-stage address selection switch (not shown here) at which the allocated address is set. In another embodiment, the safety switches 18a, 18b in each case use the coding 58 of their associated actuators 16 as address.

In a further exemplary embodiment, an address is assigned to the series-connected safety switches 18a, 18b in an initialization mode after activation of the safety circuit 80. A preferred method of performing this address assignment is shown by means of FIG. 4.

Figure 4:
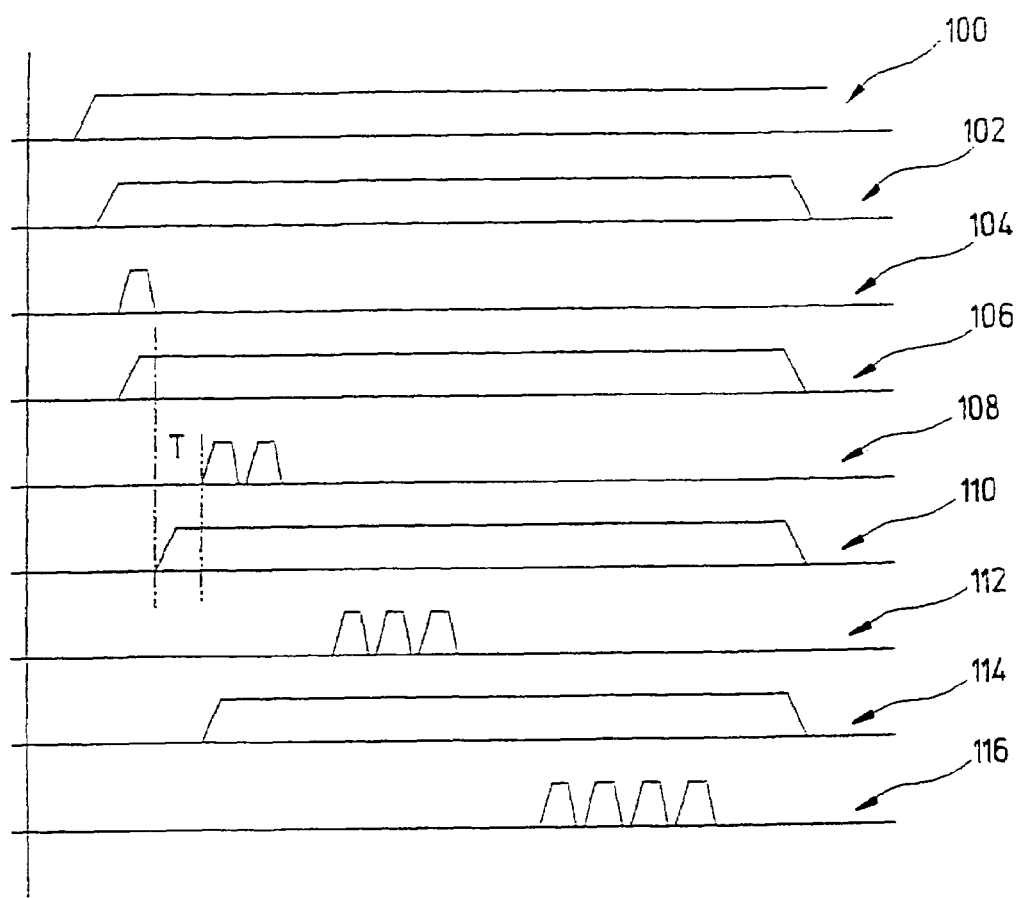
FIG. 4 shows a timing diagram with signal variations during the initialization of a safety circuit according to FIG. 3.

FIG. 4 shows the signal diagrams for this initialization mode. The topmost pulse sequence 100 is the switching-on of the operating voltage $U_B$ for all components of the safety circuit 80. At reference number 102, the signal at the first clock output of the safety controller 20, i.e. the signal on line 88, is shown. At reference number 104, the signal at the second clock output of the safety controller 20, i.e. the signal on line 90 is shown. After the operating voltage $U_S$ has been switched on, the first safety switch 18 thus receives a continuous High at its input 60 and a single pulse at its input 62. As soon as it detects this, it duplicates the signal present at its terminal 60, (continuous High) at its output 44 (reference number 106). After a waiting time T, it then generates at its output 46 two pulses as shown at reference number 108. The waiting time T is used for identifying whether other pulses are received at the input end.

The second safety switching device 18b receives at its inputs 60, 62 the signals 106, 108 and duplicates these at its outputs 44, 46. In doing so, it adds a further single pulse to the single pulses 108 which it receives at terminal 62. At the outputs of the second safety switch 18b, in consequence, the pulse sequences shown at reference numbers 110, 112 are present. In the same manner, other safety switching devices 18c, 18d etc (not shown in FIG. 3) would duplicate a continuous High on one signal line (reference number 114) and a pulse sequence on the second signal line, and each safety switch would increase the pulse sequence by one pulse.

At the end of the chain, the safety controller 20 receives the signals according to reference numbers 114, 116. From the signal 114, the safety controller 20 detects that the wiring of channel A is correct. From pulse sequence 116, the safety controller 20 detects that the wiring of channel B is correct. In addition, it can determine the number of safety switches 18a, 18b etc. arranged in series from the number of pulses minus 1. In the same manner, each safety switch 18a, 18b can identify its address from the number of pulses received. In this manner, an individual address can be automatically assigned to each series-connected safety switch when the safety circuit 80 is switched on. If the safety circuit 80 is changed later, a new and correct address allocation to the configuration then existing is automatically effected when it is switched on again.

The flexibility of the new signalling devices is increased further by the input terminal 64, which has not been explained up to now. This terminal can be used for feeding an external feedback signal into the safety switch 18. By this means, it is possible, for example, that the safety switch 18 drives a contactor with positively driven contacts independently, i.e. without any hitherto used safety switching device or a corresponding safety controller. It is sufficient if the positively driven normally-closed contact of the contactor is connected to the feedback input 64 of the safety switch 18.

In further exemplary embodiments, signalling devices such as the safety switch 18 shown also have a further input terminal for applying a start signal. It is thus possible, without the hitherto used safety controller, to also implement a monitored restart of the installation.

Furthermore, the respective operation of the signalling devices 18 can be parameterized by the input terminal 64 as is known, for example, from DE 100 16 712 A1. In addition, parameterization can be effected from the outside by means of different transponder codings.

What is claimed is:

1. A safety switch for a safety circuit adapted to interrupt the supply of power to an installation in a failsafe manner, the safety switch comprising:
    at least one input terminal for receiving an external input signal,
    a monitoring device for monitoring a current state of an actuator or a signaling device having at least two different states and providing a first signal identifying the current state of the actuator or signaling device,
    at least one output terminal,
    a control part for processing the external input signal and the first signal from the monitoring device,
    at least one switching element having at least one active and one inactive switching state, and
    a diagnostic function for identifying a functional fault,
    wherein the control part is configured to control the at least one switching element in order to generate an output signal at the at least one output terminal in accordance with said external input signal and said first signal,
    wherein the control part is further configured to transfer the at least one switching element into the inactive state when a functional fault is identified in order to generate an output signal at the at least one output terminal to effect the interruption of power to the installation, and
    further wherein the control part is still further configured, after a predetermined time period following interruption of power to the installation, to automatically generate a pulse-shaped data message at the at least one output terminal, which data message is dependent on the functional fault identified.

2. The safety switch of claim 1, wherein the control part is configured to generate the data message by means of the at least one switching element.

3. The safety switch of claim 1, wherein the control part is configured to generate the data message redundantly by means of at least two switching elements.

4. The safety switch of claim 1, wherein the control part is configured to include an address in the data message.

5. The safety switch of claim 1, further comprising an initialization mode in which the control part generates a pulse sequence which contains more pulses than the external input signal.

6. The safety switch of claim 1, further comprising an actuator adapted to be alternated between a first state and at least one second state.

7. The safety switch of claim 1, further including a housing, wherein said monitoring device, said at least one switching element and said control part are disposed within said housing, and further wherein said at least one input terminal and said at least one output terminal are accessible on the outside of said housing.

8. A safety circuit arrangement for fail-safely switching off a hazardous installation having a power supply path, comprising at least a first and a second safety switch connected in series to a higher-level safety controller configured to interrupt the power supply path to the installation as a function of the safety switches, wherein the first and the second safety switches each comprise at least one input terminal for receiving an external input signal and at least one output terminal, the output terminal from said first safety switch being connected to the input terminal of said second safety switch and the output terminal from said second safety switch being connected to the safety controller, each of said first and second safety switches having a control part for processing the external input signal, and at least one switching element having at least one active and one inactive switching state, and a diagnostic function for identifying a functional fault, wherein the control part of said first safety switch is configured to control its respective switching element in order to generate an output signal at its respective output terminal in accordance with the external input signal, wherein the control part of said first safety switch is further configured to transfer its respective switching element into the inactive state when a functional fault is identified in order to generate a first output signal at its respective output terminal, wherein the control part of said second safety switch is configured in response to the first output signal from said first safety switch to transfer its respective switching element into the inactive state in order to generate a second output signal at its respective output terminal directing the safety controller to interrupt the power supply path to said installation, the control part of said first safety switch being still further configured to thereafter generate a first data message signal at its respective output terminal, which first data message is dependent on the functional fault identified, the control part of said second safety switch being further configured in response to said first data message signal to replicate said first data message at its respective output terminal, and wherein the safety controller is configured to receive and process the data messages of the safety switches.

9. The safety circuit arrangement of claim 8, wherein the control part in each safety switch is configured to generate the data message by means of its respective switching element.

10. The safety circuit arrangement of claim 8, wherein each safety switch further comprises at least two mutually redundant switching elements arranged for being controlled redundantly by its respective control part.

11. The safety circuit arrangement of claim 10, wherein each control part is configured to generate the data message redundantly by means of its respective two switching elements.

12. The safety circuit arrangement of claim 8, wherein the control part in each safety switch is configured to control the at least one switching element pulsewise in order to generate a pulse-shaped data message.

13. The safety circuit arrangement of claim 8, wherein the control part in each safety switch is configured to include an address in the data message.

14. The safety circuit arrangement of claim 8, wherein each safety switch further comprises an initialization mode in which the control part generates a pulse sequence which contains more pulses than the external input signal.

15. The safety circuit arrangement of claim 8, wherein at least one of said first and second safety switches comprises an actuator adapted to be alternated between a first state and at least one second state.

16. A safety switch for a safety circuit adapted to interrupt the supply of power to an installation in a failsafe manner, the safety switch comprising:
    a first input terminal for receiving a first external input signal and at least one second input terminal for receiving a second external input signal,
    a monitoring device for monitoring a current state of an actuator or a signaling device having at least two different states and providing a monitoring signal identifying the current state of the actuator or signaling device, a first and at least one second output terminal, a control part for processing the external input signals and the monitoring signal from the monitoring device, a first and at least one second switching element each having at least one active and one inactive switching state, the first switching element being coupled to the first output terminal and the at least one second switching element being coupled to the at least one second output terminal, and a diagnostic function for identifying a functional fault, wherein the control part is configured to control the first and the at least one second switching elements in order to generate output signals at the first and the at least one second output terminals in accordance with said external input signals and said monitoring signal, wherein the control part is further configured to transfer the first and the at least one second switching element into the inactive state when a functional fault is identified in order to generate at least two redundant output signals at the first and the at least one second output terminal to effect the interruption of power to the installation, and further wherein the control part is still further configured, after a predetermined time period following interruption of power to the installation, to automatically generate a data message at least one of the first and second output terminals, which data message is dependent on the functional fault identified.

17. The safety switch of claim 16, wherein the control part is configured to generate the data message by means of the at least one of the first and second switching elements.

18. The safety switch of claim 16, wherein the control part is configured to generate the data message redundantly by means of the first and the at least one second switching elements.

19. The safety switch of claim 16, further comprising an initialization mode in which the control part generates a pulse sequence at least one of the output terminals, which pulse sequence contains more pulses than an external input signal received at one of the first and the at least one second input terminals.

20. A safety circuit arrangement for fail-safely switching off a hazardous installation having a power supply path, comprising at least a first and a second safety switch and comprising a higher-level safety controller configured to interrupt the power supply path to the installation as a function of the safety switches, wherein the first and the second safety switches each comprise first and second input terminals for receiving external input signals and first and second output terminals, the first and the second safety switches being connected in series so that the output terminals from the first safety switch are connected to the input terminals of the second safety switch and the first and the second output terminals from the second safety switch are connected to the safety controller, each of said first and second safety switches further having a control part for processing the external input signals received at its respective first and second input terminals, and first and second switching elements each having at least one active and one inactive switching state, and a diagnostic function for identifying a functional fault, wherein each control part is configured to control the first and second switching elements of the respective safety switch in order to generate output signals at the first and the second output terminals of the respective safety switch in accordance with the external input signals received at the first and second input terminals of the respective safety switch, wherein the control part of said first safety switch is further configured to transfer the first and the second switching elements of said first safety switch into the inactive state when a functional fault is identified in order to generate first output signals at said first and second output terminals of said first safety switch, wherein the control part of said second safety switch is configured in response to said first output signals from said first safety switch to control the first and second switching elements of the second safety switch into the inactive state in order to generate second output signals at the first and second output terminals of said second safety switch directing the safety controller to interrupt the power supply path to said installation, and the control part of said first safety switch being still further configured to thereafter generate a data message signal redundantly at both said first and second output terminals of said first safety switch, which data message is dependent on the functional fault identified, the control part of said second safety switch being further configured in response to said data message signal from said first safety switch to replicate said data message redundantly at both said first and second output terminals of said second safety switch, and wherein the safety controller is configured to receive and process the data messages of the safety switches.

21. The safety circuit arrangement of claim 20, wherein the control part in each safety switch is configured to generate the data message by means of at least one of the first and the at least one second switching elements.

22. The safety circuit arrangement of claim 20, wherein the control part of said first safety switch is configured to generate the data message redundantly by means of the first and the second switching elements.

23. The safety circuit arrangement of claim 20, wherein the control part in each safety switch is configured to control the first and the second switching elements pulsewise in order to generate a pulse-shaped data message.

24. The safety circuit arrangement of claim 20, wherein the control part in each safety switch is configured to include an address in the data message.

25. The safety circuit arrangement of claim 20, wherein each safety switch further comprises an initialization mode in which the control part generates a pulse sequence at the output terminals, which pulse sequence contains more pulses than an external input signal received at the first and the second input terminals.

* * * * *